United States Patent
Collins et al.

(10) Patent No.: US 10,283,681 B2
(45) Date of Patent: May 7, 2019

(54) PHOSPHOR-CONVERTED LIGHT EMITTING DEVICE

(71) Applicant: Cree, Inc., Durham, NC (US)

(72) Inventors: Brian T. Collins, Holly Springs, NC (US); Matthew Donofrio, Raleigh, NC (US); Kevin W. Haberern, Cary, NC (US); Bennett Langsdorf, Cary, NC (US); Anoop Mathew, Raleigh, NC (US); Harry A. Seibel, Morrisville, NC (US); Iliya Todorov, Durham, NC (US); Bradley E. Williams, Cary, NC (US)

(73) Assignee: Cree, Inc., Durham, NC (US)

( * ) Notice: Subject to any disclaimer, the term of this patent is extended or adjusted under 35 U.S.C. 154(b) by 64 days.

(21) Appl. No.: 14/120,297

(22) Filed: May 14, 2014

(65) Prior Publication Data

US 2015/0069430 A1    Mar. 12, 2015

Related U.S. Application Data (60) Provisional application No. 61/877,023, filed on Sep. 12, 2013.

(51) Int. Cl.
*H01L 33/00* (2010.01)
*H01L 33/50* (2010.01)
*H01L 33/44* (2010.01)

(52) U.S. Cl.
CPC .............. *H01L 33/50* (2013.01); *H01L 33/44* (2013.01)

(58) Field of Classification Search
CPC ....... H01L 33/44; H01L 33/50; H01L 33/504; H01L 27/153
(Continued)

(56) References Cited

U.S. PATENT DOCUMENTS 6,969,874 B1 * 11/2005 Gee .................. H01L 33/105
                                                          257/94
7,791,265 B2    9/2010 Fiedler et al.
(Continued)

OTHER PUBLICATIONS

Kelly,Lance K. et al., "The Optical Properties of Metal Nanoparticles: The Influence of Size, Shape, and Dielectric Environment," *J. Phys. Chem B*, 107 (2003) pp. 668-677.
(Continued)

*Primary Examiner* — Dale E Page
*Assistant Examiner* — Quovaunda V Jefferson
(74) *Attorney, Agent, or Firm* — Brinks Gilson & Lione

(57) ABSTRACT

A phosphor-converted light emitting device includes a light emitting diode (LED) on a substrate, where the LED comprises a stack of epitaxial layers comprising a p-n junction. A wavelength conversion material is in optical communication with the LED. According to one embodiment of the phosphor-converted light emitting device, a selective filter is adjacent to the wavelength conversion material, and the selective filter comprises a plurality of nanoparticles for absorbing light from the LED not down-converted by the wavelength conversion material. According to another embodiment of the phosphor-converted light emitting device, a perpendicular distance between a perimeter of the LED on the substrate and an edge of the substrate is at least about 24 microns. According to another embodiment of the phosphor-converted light emitting device, the LED comprises a mirror layer on one or more sidewalls thereof for reducing light leakage through the sidewalls.

5 Claims, 6 Drawing Sheets

(58) Field of Classification Search
USPC .......................................................... 257/89
See application file for complete search history.

(56) References Cited

U.S. PATENT DOCUMENTS

| | | | |
|---|---|---|---|
| 7,927,512 B2 | 4/2011 | Murazaki et al. | |
| 7,938,983 B2 | 5/2011 | Mueller-Mach et al. | |
| 8,038,905 B2 | 10/2011 | Mueller-Mach et al. | |
| 2003/0042507 A1* | 3/2003 | Slater et al. ................... | 257/200 |
| 2005/0023550 A1* | 2/2005 | Eliashevich ........ | H01L 25/0753 |
| | | | 257/99 |
| 2005/0184638 A1* | 8/2005 | Mueller et al. ................ | 313/485 |
| 2006/0033081 A1* | 2/2006 | Hintzen ................ | C04B 35/597 |
| | | | 252/301.4 F |
| 2006/0138435 A1* | 6/2006 | Tarsa .................. | H01L 25/0753 |
| | | | 257/89 |
| 2006/0181192 A1* | 8/2006 | Radkov ................ | C09K 11/584 |
| | | | 313/486 |
| 2006/0284195 A1* | 12/2006 | Nagai ...................... | F21K 9/00 |
| | | | 257/98 |
| 2007/0029565 A1* | 2/2007 | Masuda ............. | C09K 11/0883 |
| | | | 257/98 |
| 2008/0220260 A1* | 9/2008 | Schmidt ................ | C04B 35/597 |
| | | | 428/426 |
| 2010/0327295 A1* | 12/2010 | Peng et al. ...................... | 257/88 |
| 2011/0012141 A1 | 1/2011 | Le Toquin et al. | |
| 2011/0248296 A1* | 10/2011 | Choi ..................... | H01L 33/504 |
| | | | 257/89 |
| 2012/0119237 A1* | 5/2012 | Leatherdale .......... | H01L 27/156 |
| | | | 257/88 |
| 2012/0326159 A1 | 12/2012 | Bergmann et al. | |
| 2013/0341634 A1 | 12/2013 | Heikman et al. | |
| 2014/0361327 A1* | 12/2014 | Chae ....................... | H01L 33/22 |
| | | | 257/98 |

OTHER PUBLICATIONS

Mach-Mueller, Regina et al., "All-Nitride Monochromatic Amber-Emitting Phosphor-Converted Light-Emitting Diodes," *Phys. Status Solidi RRL*, 3, No. 7-8 (2009) pp. 215-217.

Oldenburg, Steven.J., "Silver Nanoparticles: Properties and Applications," Published online at http://sigmaaldrich.com/materials-science/nanomaterials/silver-nanoparticles.html, (2013) pp. 1-4.

Luxeon Rebel Amber Product Brief, PB 62, Dec. 17, 2012.

Cree® MegaBright® LEDs Data Sheet, CxxxMB290-Sxx00 (2014) pp. 1-5.

SuperBlue™ Generation II LEDs Preliminary Data Sheet, C430CB290-S2100, (2008) pp. 1-4.

* cited by examiner

PHOSPHOR-CONVERTED LIGHT EMITTING DEVICE

RELATED APPLICATION

The present patent document claims the benefit of the filing date under 35 U.S.C. § 119(e) of U.S. Provisional Patent Application Ser. No. 61/877,023, filed Sep. 12, 2013, which is hereby incorporated by reference in its entirety.

TECHNICAL FIELD

The present disclosure is directed generally to light emitting devices and more particularly to phosphor-converted light emitting devices.

BACKGROUND

Light emitting diodes (LEDs) are solid state devices that convert electric energy to light, and generally comprise one or more active layers of semiconductor material sandwiched between oppositely doped layers so as to define a p-n junction. When a bias is applied across the p-n junction, holes and electrons are injected into the active layer where they recombine to generate light in a process called injection electroluminescence. Light may be emitted from the active layer through all surfaces of the LED.

As most LEDs are nearly monochromatic light sources that appear to emit light having a single color, light emitting devices or lamps including multiple LEDs that can emit light of different colors have been employed to produce white light. In these devices, the different colors of light emitted by the individual LEDs combine to produce a desired intensity and/or color of white light. For example, by simultaneously energizing red, green and blue light emitting LEDs, the resulting combined light may appear white, or nearly white.

As an alternative to combining individual LEDs to produce light emitting devices having a particular light emission spectrum, phosphors may be used to control the color of light emitted from LEDs. A phosphor may absorb a portion of the light emitted from an LED at a given wavelength and re-emit the light at different wavelength via the principle of photoluminescence. The conversion of light having a shorter wavelength (or higher frequency) to light having a longer wavelength (or lower frequency) may be referred to as down conversion. For example, a down-converting phosphor may be combined with a blue LED to convert some of the blue wavelengths to yellow wavelengths in order to generate white light.

For some applications, it is desirable that substantially all of the light emitted from an LED is converted to longer wavelength light by the phosphor in order to produce light of a desired color. For example, it is of interest to combine blue LEDs with phosphors capable of emitting yellow, amber (orange) or red light for applications such as traffic lights and automotive lights. While LEDs can be designed to emit yellow to red light without phosphor conversion (e.g., AlInGaP LEDs), such devices tend to have temperature-dependent emission properties and lower efficiencies than blue LEDs.

A challenge with phosphor-converted LEDs designed for down conversion of blue light, however, is that some portion of light from the LED may pass through the phosphor without being converted to the desired wavelength. For example, in the case of a phosphor-converted LED that combines a blue LED with a down-converting phosphor for amber light emission, there may be blue light leakage that diminishes the color purity of the emitted light.

BRIEF SUMMARY

According to a first embodiment, a phosphor-converted light emitting device comprises a light emitting diode (LED) on a substrate, where the LED includes a stack of epitaxial layers. A wavelength conversion material is in optical communication with the LED, and a selective filter is adjacent to the wavelength conversion material, where the selective filter comprises a plurality of nanoparticles for absorbing light from the LED not down-converted by the wavelength conversion material.

According to a second embodiment, a phosphor-converted light emitting device comprises a light emitting diode (LED) on a substrate, where the LED comprises a stack of epitaxial layers. A wavelength conversion material is in optical communication with the LED, and a perpendicular distance between a perimeter of the LED on the substrate and an edge of the substrate is at least about 24 microns.

According to a third embodiment, a phosphor-converted light emitting device comprises a light emitting diode (LED) on a substrate, where the LED comprising a stack of epitaxial layers. A wavelength conversion material is in optical communication with the LED, and the LED comprises a mirror layer on one or more sidewalls thereof for reducing light leakage through the sidewalls.

DETAILED DESCRIPTION

As used in the present disclosure, a "phosphor" or "wavelength conversion material" may refer to a material that absorbs light at one wavelength and re-emits the light at a different wavelength, where the re-emission includes visible light. The terms phosphor and wavelength conversion material may in some cases be used interchangeably.

"Peak emission wavelength" refers to the wavelength of light at which the emission intensity of a phosphor or an LED is a maximum. LEDs typically have a light emission spectrum or intensity distribution that is tightly centered about the peak emission wavelength. The light emission spectrum of a phosphor or an LED may be further characterized in terms of the width of the intensity distribution measured at half the maximum light intensity (referred to as the full width at half maximum or "FWHM" width).

"Dominant wavelength" refers to the wavelength of light that has the same apparent color as the light emitted from the phosphor or LED as perceived by the human eye. Thus, the dominant wavelength differs from the peak wavelength in that the dominant wavelength takes into account the sensitivity of the human eye to different wavelengths of light.

A first device or phosphor that is described as being "in optical communication with" a second device or phosphor is positioned such that light emitted from the first device reaches the second device.

As used herein, "ccx" or "CCx" refers to correlated color X and "ccy" or "CCy" refers to correlated color y, where these color coordinates (ccx, ccy) are calculated using the standard color matching functions that describe the 1931 CIE color space or chromaticity diagram. As would be recognized by one of ordinary skill in the art, the closer the chromaticity color coordinates are to the spectral locus, the higher the color purity. The color may also be said to be more saturated.

The term "bins" or "color bins" refers to partitions of the 1931 CIE chromaticity diagram. The bins or color bins may have coordinates defined by the SAE International Surface Vehicle Standard J578 (July, 2012), which is hereby incorporated by reference in its entirety.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, of manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

First Embodiment

Figure 1A:
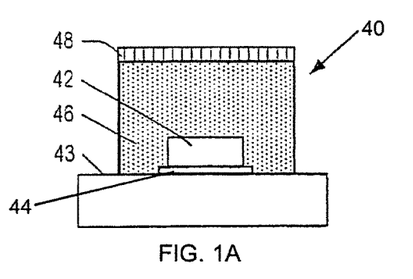
FIGS. 1A-1D show cross-sectional views of exemplary phosphor-converted light emitting devices that include a selective filter comprising nanoparticles.
Figure 1B:
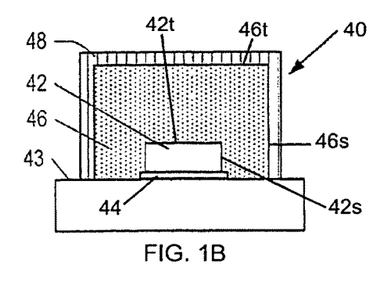
Figure 1C:
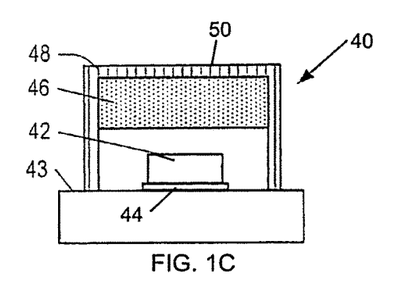

Referring to FIG. 1A, a phosphor-converted light emitting device 40 includes an LED 42 on a substrate 44, which is on a carrier 43. The LED 42 comprises a stack of epitaxial layers including a p-n junction. A wavelength conversion material or phosphor 46 is in optical communication with the LED 42. A color filter or selective filter (in this example, a selective filter layer) 48 is adjacent to the wavelength conversion material 46. The selective filter includes a plurality of nanoparticles to absorb light from the LED that is not down-converted by the wavelength conversion material. Accordingly, light emitted from the phosphor-converted light emitting device may have a high color purity, such as at least about 95%, at least about 98%, or at least about 99%.

Figure 1D:
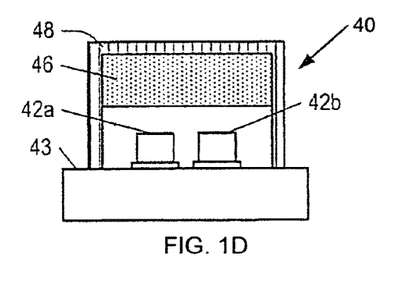

In the examples of FIGS. 1A-1D, the nanoparticles of the selective filter are dispersed in a selective filter layer 48 positioned such that the wavelength conversion material 46 is between the selective filter layer 48 and the LED 42. Referring to FIG. 1A, the selective filter layer 48 comprising the nanoparticles is disposed on a top portion 46$t$ of the wavelength conversion material 46, and in FIG. 1B, the selective filter layer 48 is further disposed on (or adjacent to) one or more side portions 46$s$ of the wavelength conversion material 46. As shown, the wavelength conversion material may be coated directly onto the LED 42, followed by deposition of the selective filter layer 48. Alternatively, the wavelength conversion material 46 and the selective filter layer 48 may be applied to another surface, such as an optic 50, that is remote from (e.g., not in physical contact with) the LED as illustrated, for example, in FIG. 1C. In all of these examples, the selective filter layer 48 overlies the top 42$t$ and/or sidewalls 42$s$ of the LED 42. FIG. 1D illustrates that multiple LEDs 42$a$, 42$b$ may be in optical communication with the wavelength conversion material 46 and the selective filter layer 48, in some configurations.

The nanoparticles of the selective filter may also or alternatively be dispersed within the wavelength conversion material. For example, the nanoparticles may be added to and mixed with phosphor particles and a polymeric dispersant or encapsulant prior to coating the wavelength conversion material onto the LED or onto an optic of the LED.

The selective filter layer may comprise a thickness of from about 10 nm to about 10 microns. In addition to the nanoparticles, the selective filter layer may comprise a polymeric dispersant, encapsulant or other additive (e.g., an optical epoxy) to aid in uniformly dispersing the nanoparticles into a formulation that may be coated onto the wavelength conversion material or another surface adjacent to the wavelength conversion material.

The nanoparticles may comprise a metal (or an alloy comprising two or more metals). Due to the high surface area of the nanoparticles, it may be advantageous for the metal to be a noble metal or a metal known for resistance to oxidation. For example, the metal may be selected from the group consisting of silver, gold, platinum, palladium, ruthenium, rhodium, osmium, iridium, titanium, niobium and tantalum. Advantageously, the metal may be silver.

It is known that metal (e.g., silver) nanoparticles strongly absorb and scatter light, and their color is influenced by the size and shape of the particles. The strong interaction with light is due to a phenomenon called surface plasmon resonance, in which conduction electrons on the metal surface undergo a collective oscillation when excited by certain wavelengths of light. The absorption and scattering properties of metal nanoparticles may be adjusted by controlling the particle size, shape, and the local refractive index near the particle surface, as discussed in, for example, "The Optical Properties of Metal Nanoparticles: The Influence of Size, Shape, and Dielectric Environment," K. Lance Kelly et al., *J. Phys. Chem. B*, 2003, 107 (3), pp 668-677.

The nanoparticles employed for the selective filter may have an average primary particle size (or crystallite size) of from about 1 nm to about 200 nm, or from about 1 nm to about 100 nm. The primary particle size of the nanoparticles may also lie within the range of from about 10 nm to about 100 nm, or from about 20 nm to 70 nm. These ranges may be particularly beneficial for blue light absorption if the nanoparticles comprise silver.

The LED may be a blue LED comprising a dominant wavelength in a range of about 425 nm to about 475 nm. The wavelength conversion material may comprise a peak emission wavelength in a range of from about 500 nm to about 660 nm. If substantially all of the light emitted by the blue LED is down converted by the wavelength conversion material, then yellow, orange (amber), green and/or red light of a high color purity may be emitted from the phosphor-converted light emitting device. When amber light emission is desired, the peak emission wavelength of the wavelength conversion material may be in a range of from about 585 nm to about 610 nm. When green light emission is desired, the peak emission wavelength of the wavelength conversion material may be in the range of from about 498 nm to about 550 nm. When selective yellow light emission is desired, e.g., per the SAE International Surface Vehicle Standard J578 (July, 2012), then the peak emission wavelength may be in the range from about 575 nm to about 585 nm.

To achieve down-conversion to the desired wavelength, the wavelength conversion material may comprise a phosphor capable of converting blue light to saturated light having the desired wavelength. Such phosphors may be selected from the group consisting of $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_5O_{12}:Ce^{3+}$, $Lu_{3-y}Y_yAl_{5-x}Ga_xO_{12}:Ce^{3+}$, $Y_3Al_5O_{12}:Ce^{3+}$, $Y_3Al_{5-x}Ga_xO_{12}:Ce^{3+}$, $Y_{3-y}Gd_yAl_5O_{12}:Ce^{3+}$, $Y_{3-y}Gd_yAl_{5-x}Ga_xO_{12}:Ce^{3+}$, where $0<y<3$ and $0<x<5$, BOSE: $Eu^{2+}$ (europium-doped barium orthosilicate), $AE_3SiO_5:Eu^{2+}$ (AE=Ca, Sr, Ba and their stoichiometric mixtures), $BaSi_2SN_{2.67}:Eu^{2+}$ (BSSN), $Ae_2Si_5N_8:Eu^{2+}$ (Ae=Ca, Sr, Ba and their stoichiometric mixtures), $AeAlSiN_3:Eu^{2+}$ (Ae=Ca, Sr, Ba and their stoichiometric mixtures), $AeAlSiN_3:Ce^{3+}$, $Li^+$ (Ae=Ca, Sr, Ba and their stoichiometric mixtures), $AeSiN_2:Ce^{3+}$, $Li^+$ (Ae=Ca, Sr, Ba and their stoichiometric mixtures), α-SiAlON ceramics doped with $Eu^{2+}$, and β-SiAlON ceramics doped with $Eu^{2+}$.

To achieve amber light emission with a peak emission wavelength in the range of from about 585 nm to about 610 nm, suitable phosphors may include, for example, $Ae_2Si_5N_8:Eu^{2+}$ (Ae=Ca, Sr, Ba and their stoichiometric mixtures), α-SiAlON ceramics doped with $Eu^{2+}$, β-SiAlON ceramics doped with $Eu^{2+}$ and/or $Y_3Al_5O_{12}:Ce^{3+}$. To achieve green light emission with a peak emission wavelength in the range of from about 498 nm to about 550 nm, suitable phosphors may include $Ae_2Si_5N_8:Eu^{2+}$ (Ae=Ca, Sr, Ba and their stoichiometric mixtures), α-SiAlON ceramics doped with $Eu^{2+}$, β-SiAlON ceramics doped with $Eu^{2+}$, $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_{5-x}O_{12}:Ce^{3+}$, and/or $Lu_{3-y}Y_yAl_{5-x}Ga_xO_{12}:Ce^{3+}$ To achieve selective yellow light emission with a peak emission wavelength in the range of from about 575 nm to about 585 nm, suitable phosphors may include $Ae_2Si_5N_8:Eu^{2+}$ (Ae=Ca, Sr, Ba and their stoichiometric mixtures), α-SiAlON ceramics doped with $Eu^{2+}$, and/or β-SiAlON ceramics doped with $Eu^{2+}$ and $Y_3Al_5O_{12}:Ce^{3+}$.

Due to the presence of the light absorbing nanoparticles, a reduced thickness of the wavelength conversion material may be possible without increasing blue light leakage from the device. For example, the wavelength conversion material may comprise a layer on the LED having a thickness of no more than about 160 microns, no more than about 140 microns, no more than about 120 microns, no more than about 100 microns, or no more than about 80 microns. For example, the thickness may range from about 50 microns to about 150 microns, or from about 60 microns to about 120 microns. Typically, the wavelength conversion material includes phosphor particles dispersed in a polymeric binder or encapsulant, as known to those skilled in the art.

The phosphor-converted light emitting device may further comprise, as described in more detail below in the section entitled "Third Embodiment," a mirror layer on one or more sidewalls of the LED for preventing light leakage therethrough.

It is also contemplated that a perpendicular distance between the perimeter of the LED on the substrate and an edge of the substrate is at least about 24 microns. This aspect of the light emitting device is described in greater detail in the following section entitled "Second Embodiment."

Accordingly, the phosphor-converted light emitting device may emit light having a saturated color purity of at least about 85%, at least about 90%, at least about 95%, at least about 98%, or at least about 99%.

Figure 7:
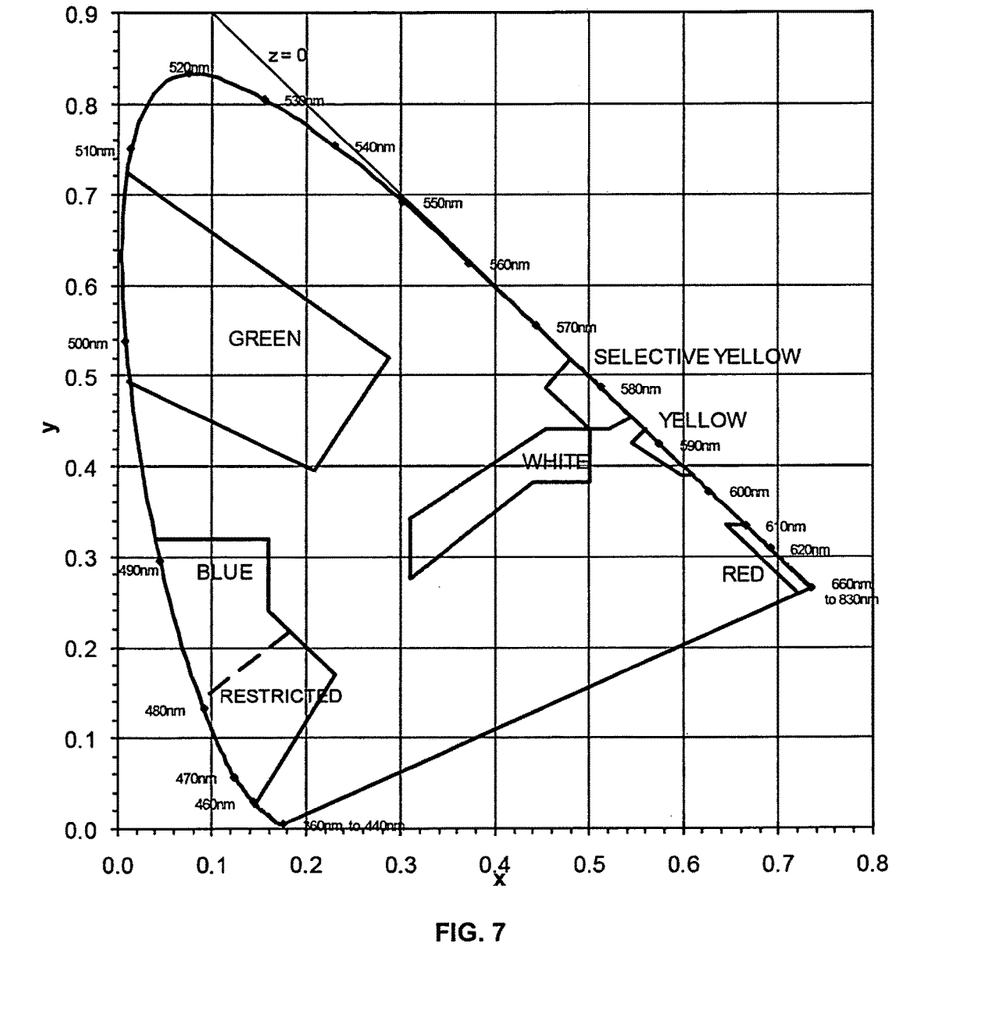
FIG. 7 shows a chromaticity diagram including color bins as defined by SAE International Surface Vehicle Standard J578, July, 2012.

Referring to FIG. 7, the light emitted from the phosphor-converted light emitting device may have ccx and ccy coordinates that fall within the selective yellow color bin defined by the following equations (according to SAE J578; July, 2012), where y may be understood to represent ccy and x may be understood to represent ccx:

$y=1.290x-0.100$ $y=0.138+0.580x$ $y=0.440$ and $y=0.940-x$

Alternatively, the light emitted from the phosphor-converted light emitting device may have ccx and ccy coordinates that fall within the green color bin defined by the following equations (according to SAE J578; July, 2012), where y may be understood to represent ccy and x may be understood to represent ccx:

$y=0.730-0.730x$ $x=0.630y-0.040$ $y=0.500-0.500x$

Alternatively, the light emitted from the phosphor-converted light emitting device may have ccx and ccy coordinates that fall within the amber color bin defined by the following equations (according to SAE J578; July, 2012), where y may be understood to represent ccy and x may be understood to represent ccx:

$y=x-0.120$ $y=0.390$ $y=0.790-0.670x$

Examples

Figure 6A:
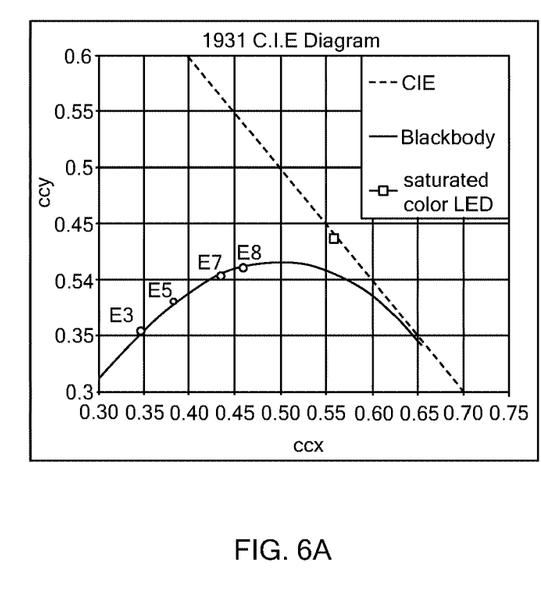
FIGS. 6A and 6B show exemplary emission spectra of a phosphor-converted light emitting device in which a blue LED is combined with a SiAlON phosphor having an emission peak of 595 nm.
Figure 6B:
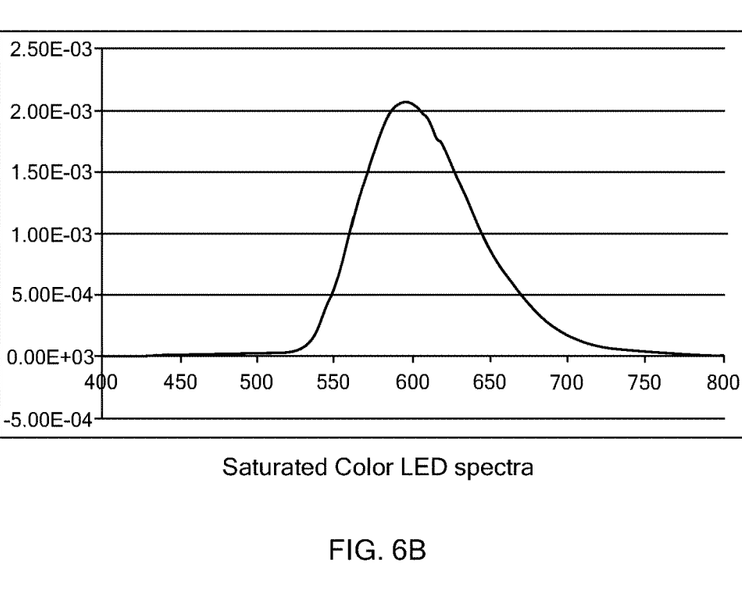

FIGS. 6A and 6B show exemplary emission spectra of a phosphor-converted light emitting device in which a blue LED is combined with a SiAlON phosphor having a peak emission wavelength of 595 nm. The LED (die) was completely covered with a phosphor particle-encapsulant mixture in a 1:1 ratio, and a color purity of 99% was achieved. A filter including silver nanoparticles was not employed in this example, and it is believed the high color purity was achieved due to the use of a relatively large phosphor thickness (e.g., about 120 microns to about 160 microns); however, a thicker phosphor layer to ensure that all of the blue light is absorbed in the phosphor layer can lead to a reduced brightness.

Silver nanoparticles (about 20 nm in average size) in acetone were mixed with an optical epoxy and then applied as a selective filter layer after a phosphor layer was deposited on a blue LED. The results showed a 60% reduction in the blue peak intensity compared to results without the phosphor layer. The blue peak was at about 447 nm. There was a reduction in the amber intensity; however, it was only 8% for a peak emission of 593 nm. Some agglomeration of the particles may be the cause of the emission decrease at 593 nm.

Second Embodiment

Figure 2:
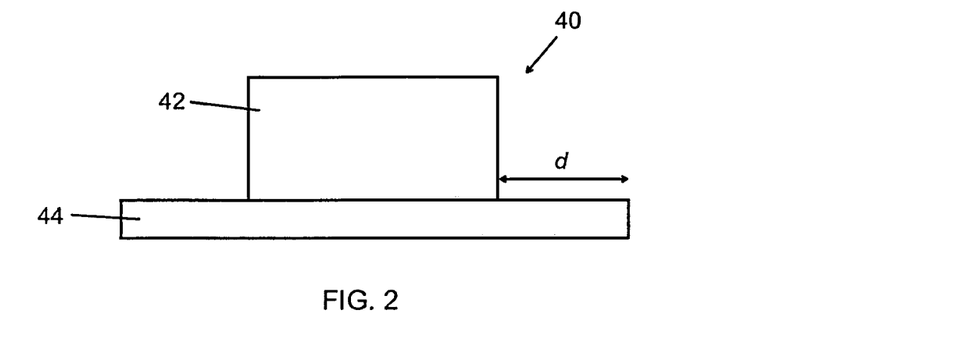
FIG. 2 shows a cross-sectional view of an exemplary LED on a substrate, where a perimeter of the LED on the substrate is spaced a distance d from an edge of the substrate.
Figure 3:
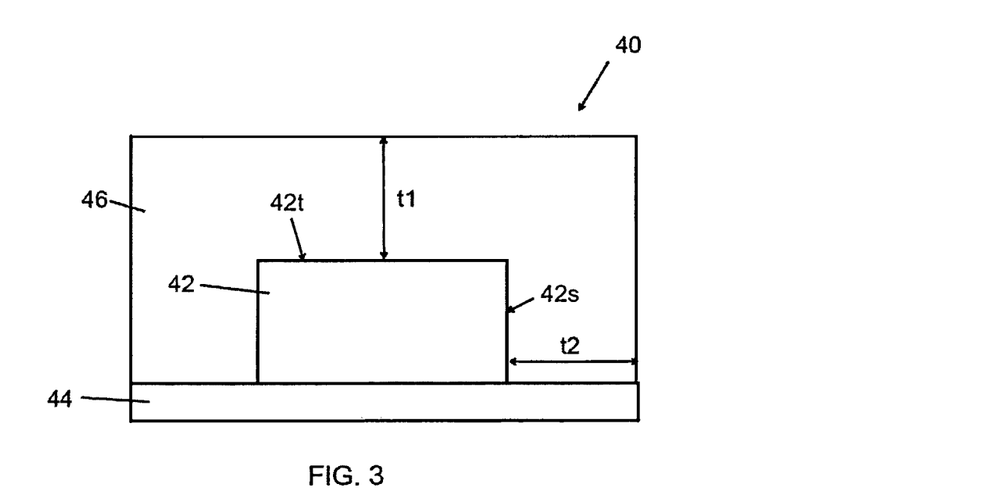
FIG. 3 shows a cross-sectional view of a wavelength conversion material in optical communication with the LED of FIG. 2, where the wavelength conversion material has a top thickness t1 on top of the LED and a sidewall thickness t2 on one or more sidewalls of the LED.

Referring to FIG. 2, a phosphor-converted light emitting device 40 includes an LED 42 on a substrate 44. The LED 42 comprises a stack of epitaxial layers including a p-n junction. A wavelength conversion material or phosphor 46 is in optical communication with the LED 42, as shown in FIG. 3. An area occupied by the LED 42 on the substrate 44 defines a perimeter of the LED 42. A perpendicular distance d between the perimeter of the LED 42 on the substrate 44 and an edge of the substrate 44 is at least about 24 microns, as illustrated in FIG. 2, which is not to scale. The edge of the substrate 44 is assumed to be a planar edge, as opposed to a corner. The perpendicular distance may also be at least about 34 microns, at least about 44 microns, at least about 54 microns, at least about 64 microns, or at least about 74 microns. The perpendicular distance, which is increased compared to previous generations of light emitting devices, is determined during fabrication of the light emitting device, and may be equal to one half the distance ("street width") between mesa regions on the carrier wafer prior to sawing or singulation.

As a consequence of the increased perpendicular distance, the thickness of the wavelength conversion material covering sidewalls of the LED may be increased, as shown schematically in FIG. 3. A thicker layer (t2) of the wavelength conversion material 46 on the sidewalls—which may in some cases approach the thickness (t1) of the layer on top of the LED—may be effective in minimizing or preventing leakage of light that has not been down-converted by the phosphor. Accordingly, a ratio of the sidewall thickness t2 to the top thickness t1 may be at least about 0.2, at least about 0.3, at least about 0.4, at least about 0.5, at least about 0.6, at least about 0.7, or at least about 0.8. A maximum value of the ratio may be about 1 or greater. For example, the ratio may lie in the range of from about 0.5 to about 1. Typically, the sidewall thickness t2 may be at least about 24 microns, at least about 34 microns, at least about 44 microns, at least about 54 microns, at least about 64 microns, and at least about 74 microns on one or more (preferably all) of the sidewalls of the LED. Typically, the sidewall thickness t2 is no greater than about 160 microns, or no greater than about 140 microns. For example, the sidewall thickness t2 may be from about 30 microns to about 120 microns, from about 60 microns to about 120 microns, or from about 70 microns to about 100 microns on one or more of the sidewalls. The top thickness t1 typically is no greater than about 165 microns, no greater than about 140 microns, no greater than about 120 microns, or no greater than about 100 microns. Generally the thickness is at least about 60 microns, at least about 80 microns, at least about 100 microns, or at least about 120 microns. For example, the top thickness t1 may range from about 120 microns to about 165 microns.

Figure 4A:
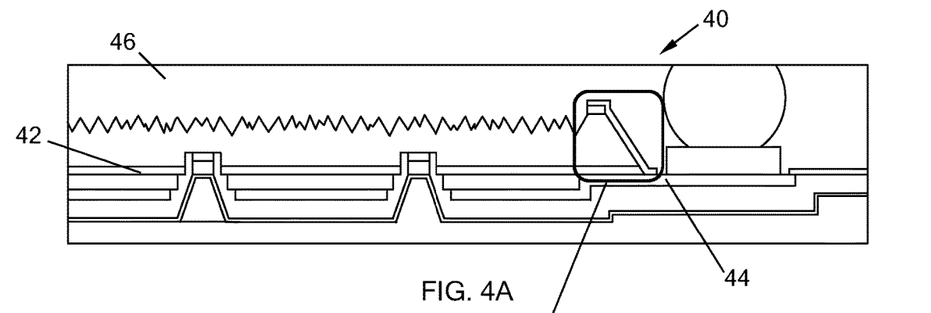
FIGS. 4A and 4B show cross-sectional views of an exemplary phosphor-converted light emitting device that includes a reflective layer on a sidewall of the LED.
Figure 4B:
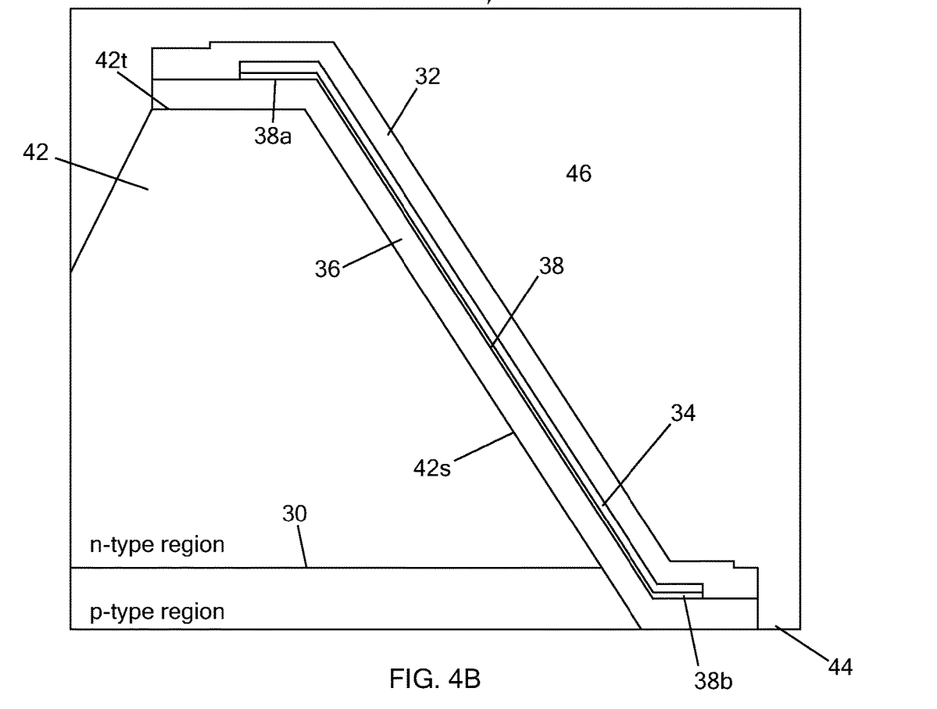

As shown schematically in FIG. 4B, one or more sidewalls 42s of the LED 42 may define an angle of less than 90° with respect to the substrate, and the sidewalls may be referred to as sloped sidewalls. In the case of sloped sidewalls, the sidewall thickness t2 refers to the thickness of the wavelength conversion material 46 on one or more sidewalls 42s of the LED as measured on the substrate 44 (at the base of the LED 42).

The substrate supporting the LED in any of the embodiments described herein may be selected from but not limited to a growth substrate, a carrier wafer, and a submount.

The LED may be a blue LED comprising a dominant wavelength in a range of about 425 nm to about 475 nm. The wavelength conversion material may comprise a peak emission wavelength in a range of from about 500 nm to about 660 nm. If substantially all of the light emitted by the blue LED is down converted by the wavelength conversion material, then yellow, orange (amber), green and/or red light of a high color purity may be emitted from the phosphor-converted light emitting device. When amber light emission is desired, the peak emission wavelength of the wavelength conversion material may be in a range of from about 585 nm to about 610 nm. When green light emission is desired, the peak emission wavelength of the wavelength conversion material may be in the range of from about 498 nm to about 550 nm. When selective yellow light emission is desired, e.g., per the SAE International Surface Vehicle Standard J578 (July, 2012), then the peak emission wavelength may be in the range from about 575 nm to about 585 nm.

To achieve down-conversion to the desired wavelength, the wavelength conversion material may comprise a phosphor capable of converting blue light to saturated light having the desired wavelength. Such phosphors may be selected from the group consisting of $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_5O_{12}:Ce^{3+}$, $Lu_{3-y}Y_yAl_{5-x}Ga_xO_{12}:Ce^{3+}$, $Y_3Al_5O_{12}$:

$Ce^{3+}$, $Y_3Al_{5-x}Ga_xO_{12}:Ce^{3+}$, $Y_{3-y}Gd_yAl_5O_{12}:Ce^{3+}$, $Y_{3-y}Gd_yAl_{5-x}Ga_xO_{12}:Ce^{3+}$, where $0<y<3$ and $0<x<5$, BOSE: $Eu^{2+}$ (europium-doped barium orthosilicate), $AE_3SiO_5:Eu^{2+}$ (AE=Ca, Sr, Ba and their stoichiometric mixtures), $BaSi_2SN_{2.67}:Eu^{2+}$ (BSSN), $Ae_2Si_5N_8:Eu^{2+}$ (Ae=Ca, Sr, Ba and their stoichiometric mixtures), $AeAlSiN_3:Eu^{2+}$ (Ae=Ca, Sr, Ba and their stoichiometric mixtures), $AeAlSiN_3:Ce^{3+}$, $Li^+$ (Ae=Ca, Sr, Ba and their stoichiometric mixtures), $AeSiN_2:Ce^{3+}$, $Li^+$ (Ae=Ca, Sr, Ba and their stoichiometric mixtures), $\alpha$-SiAlON ceramics doped with $Eu^{2+}$, and $\beta$-SiAlON ceramics doped with $Eu^{2+}$, for example.

To achieve amber light emission with a peak emission wavelength in the range of from about 585 nm to about 610 nm, suitable phosphors may include $Ae_2Si_5N_8:Eu^{2+}$ (Ae=Ca, Sr, Ba and their stoichiometric mixtures), $\alpha$-SiAlON ceramics doped with $Eu^{2+}$, $\beta$-SiAlON ceramics doped with $Eu^{2+}$, and/or $Y_3Al_5O_{12}:Ce^{3+}$. To achieve green light emission with a peak emission wavelength in the range of from about 498 nm to about 550 nm, suitable phosphors may include $Ae_2Si_5N_8:Eu^{2+}$ (Ae=Ca, Sr, Ba and their stoichiometric mixtures), $\alpha$-SiAlON ceramics doped with $Eu^{2+}$, $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_{5-x}O_{12}:Ce^{3+}$, $Lu_{3-y}Y_yAl_{5-x}Ga_xO_{12}:Ce^{3+}$ and/or $\beta$-SiAlON ceramics doped with $Eu^{2+}$. To achieve selective yellow light emission with a peak emission wavelength in the range of from about 575 nm to about 585 nm, suitable phosphors may include $Ae_2Si_5N_8:Eu^{2+}$ (Ae=Ca, Sr, Ba and their stoichiometric mixtures), $\alpha$-SiAlON ceramics doped with $Eu^{2+}$, and/or $\beta$-SiAlON ceramics doped with $Eu^{2+}$ and $Y_3Al_5O_{12}:Ce^{3+}$.

The phosphor-converted light emitting device may further include a selective filter adjacent to the wavelength conversion material. The selective filter may include a plurality of nanoparticles for absorbing light from the LED not down-converted by the wavelength conversion material layer, as described above, and/or it may have other features, such as those set forth in U.S. patent application Ser. No. 12/503,695, entitled "Single-Color Wavelength Converted Light Emitting Devices," which is hereby incorporated by reference in its entirety.

The phosphor-converted light emitting device may also comprise a mirror layer on one or more sidewalls of the stack of epitaxial layers to further inhibit light leakage through the one or more sidewalls, as described below.

Accordingly, the phosphor-converted light emitting device may emit light having a saturated color purity of at least about 85%, at least about 90%, at least about 95%, at least about 98%, or at least about 99%.

Referring to FIG. 7, the light emitted from the phosphor-converted light emitting device may have ccx and ccy coordinates that fall within the selective yellow color bin defined by the following equations (according to SAE J578; July, 2012), where y may be understood to represent ccy and x may be understood to represent ccx:

$$y=1.290x-0.100$$

$$y=0.138+0.580x$$

$$y=0.440 \text{ and}$$

$$y=0.940-x$$

Alternatively, the light emitted from the phosphor-converted light emitting device may have ccx and ccy coordinates that fall within the green color bin defined by the following equations (according to SAE J578; July, 2012), where y may be understood to represent ccy and x may be understood to represent ccx:

$$y=0.730-0.730x$$

$$x=0.630y-0.040$$

$$y=0.500-0.500x$$

Alternatively, the light emitted from the phosphor-converted light emitting device may have ccx and ccy coordinates that fall within the amber color bin defined by the following equations (according to SAE J578; July, 2012), where y may be understood to represent ccy and x may be understood to represent ccx:

$$y=x-0.120$$

$$y=0.390$$

$$y=0.790-0.670x$$

Third Embodiment

Referring to FIGS. 4A and 4B, a phosphor-converted light emitting device 40 includes an LED 42 on a substrate 44. The LED 42 comprises a stack of epitaxial layers including a p-n junction 30. A wavelength conversion material or phosphor 46 is in optical communication with the LED 42. The LED 42 includes a mirror layer 38 on one or more sidewalls 42s thereof for reducing light leakage through the sidewalls 42.

The mirror layer 38 may include one or more high reflectivity metals, which may be selected from the group consisting of Al, Ag, Au, Pt, Cu, Cr, Ni, Ti and Rh. The mirror layer 38 may have a thickness of from about 100 nm to about 300 nm, and the mirror layer 38 may conformally coat the one or more sidewalls 42s. The sidewalls 42s of the LED may be positioned substantially perpendicular to the substrate, or one or more of the sidewalls 42s may define an angle of less than 90° with respect to a substrate supporting the LED. In this case, the sidewalls 42s may be said to be sloped sidewalls 42s.

The phosphor-converted light emitting device 40 may further comprise a passivation layer 36 between the mirror layer 38 and the one or more sidewalls 42s. The passivation layer 36 may comprise a dielectric material selected from the group consisting of $SiO_2$ and SiN. The passivation layer 36 may have a thickness of from about 100 nm to about 500 nm.

The phosphor-converted light emitting device 40 may further include an adhesion layer 34 on the mirror layer. The adhesion layer 34 may comprise Ti or another material with suitable adhesion characteristics. The adhesion layer 34 may have a thickness of from about 20 nm to about 50 nm.

The phosphor-converted light emitting device may further comprise a capping layer 32 on the mirror layer 38. The adhesion layer 34 may be disposed between the capping layer 32 and the mirror layer 38. The capping layer 32 may comprise a dielectric material selected from the group consisting of SiN and $SiO_2$. The capping layer 32 may have a thickness of from about 100 nm to about 500 nm.

The mirror layer 38 may further comprise a lower horizontal portion 38b thereof extending from the one or more sidewalls 42s onto a portion of the substrate 44. The lower horizontal portion 38b of the mirror layer 38 may be encapsulated by a portion of the capping layer 32 and a portion of the passivation layer 36. The mirror layer 38 may further comprise an upper horizontal portion 38a thereof extending from the one or more sidewalls 42s onto a top portion 42t of the LED 42.

The passivation layer 36, the mirror layer 38, the adhesion layer 34, and the capping layer 32 may be applied using thin-film deposition, photolithography, and etching methods known in the art. When the LED 42 includes a textured top surface, as shown schematically in FIG. 4A, the mirror and other layers may be applied in the appropriate sequence to the one or more sidewalls 42s of the LED 42 before or after the texturing is carried out. If the texturing is carried out first, a sacrificial layer of silicon nitride or another suitable material may be applied to the side wall(s) to serve as a protective layer during the texturing process. After texturing, the sacrificial layer may be removed.

As in the previous embodiments, the substrate supporting the LED may be selected from but not limited to a growth substrate, a carrier wafer, and a submount.

The LED may be a blue LED comprising a dominant wavelength in a range of about 425 nm to about 475 nm. The wavelength conversion material may comprise a peak emission wavelength in a range of from about 500 nm to about 660 nm. If substantially all of the light emitted by the blue LED is down converted by the wavelength conversion material, then yellow, orange (amber), green and/or red light of a high color purity may be emitted from the phosphor-converted light emitting device. When amber light emission is desired, the peak emission wavelength of the wavelength conversion material may be in a range of from about 585 nm to about 610 nm. When green light emission is desired, the peak emission wavelength of the wavelength conversion material may be in the range of from about 498 nm to about 550 nm. When selective yellow light emission is desired, e.g., per the SAE International Surface Vehicle Standard J578 (July, 2012), then the peak emission wavelength may be in the range from about 575 nm to about 585 nm.

To achieve down-conversion to the desired wavelength, the wavelength conversion material may comprise a phosphor capable of converting blue light to saturated light having the desired wavelength. Such phosphors may be selected from the group consisting of $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_5O_{12}:Ce^{3+}$, $Lu_{3-y}Y_yAl_{5-x}Ga_xO_{12}:Ce^{3+}$, $Y_3Al_5O_{12}:Ce^{3+}$, $Y_3Al_{5-x}Ga_xO_{12}:Ce^{3+}$, $Y_{3-y}Gd_yAl_5O_{12}:Ce^{3+}$, $Y_{3-y}Gd_yAl_{5-x}Ga_xO_{12}:Ce^{3+}$, where $0<y<3$ and $0<x<5$, BOSE:$Eu^{2+}$ (europium-doped barium orthosilicate), $AE_2SiO_5:Eu^{2+}$ (AE=Ca, Sr, Ba and their stoichiometric mixtures), $BaSi_2SN_{2.67}:Eu^{2+}$ (BSSN), $Ae_2Si_5N_8:Eu^{2+}$ (Ae=Ca, Sr, Ba and their stoichiometric mixtures), $AeAlSiN_3:Eu^{2+}$ (Ae=Ca, Sr, Ba and their stoichiometric mixtures), $AeAlSiN_3:Ce^{3+}$, $Li^+$ (Ae=Ca, Sr, Ba and their stoichiometric mixtures), $AeSiN_2:Ce^{3+}$, $Li^+$ (Ae=Ca, Sr, Ba and their stoichiometric mixtures), α-SiAlON ceramics doped with $Eu^{2+}$, and β-SiAlON ceramics doped with $Eu^{2+}$.

To achieve amber light emission with a peak emission wavelength in the range of from about 585 nm to about 610 nm, suitable phosphors may include $Ae_2Si_5N_8:Eu^{2+}$ (Ae=Ca, Sr, Ba and their stoichiometric mixtures), α-SiAlON ceramics doped with $Eu^{2+}$, β-SiAlON ceramics doped with $Eu^2$ and/or $Y_3Al_5O_{12}:Ce^{3+}$. To achieve green light emission with a peak emission wavelength in the range of from about 498 nm to about 550 nm, suitable phosphors may include $Ae_2Si_5N_8:Eu^{2+}$ (Ae=Ca, Sr, Ba and their stoichiometric mixtures), α-SiAlON ceramics doped with $Eu^{2+}$, $Lu_3Al_5O_{12}:Ce^{3+}$, $Lu_{3-y}Y_yAl_5O_{12}:Ce^{3+}$, $Lu_3Al_{5-x}Ga_xO_{12}:Ce^{3+}$, $Lu_{3-y}Gd_yAl_{5-x}O_{12}:Ce^{3+}$, $Lu_{3-y}Y_yAl_{5-x}Ga_xO_{12}:Ce^{3+}$ and/or β-SiAlON ceramics doped with $Eu^{2+}$. To achieve selective yellow light emission with a peak emission wavelength in the range of from about 575 nm to about 585 nm, suitable phosphors may include $Ae_2Si_5N_8:Eu^{2+}$ (Ae=Ca, Sr, Ba and their stoichiometric mixtures), α-SiAlON ceramics doped with $Eu^{2+}$, and/or β-SiAlON ceramics doped with $Eu^{2+}$ and $Y_3Al_5O_{12}:Ce^{3+}$.

The phosphor-converted light emitting device may further include a selective filter adjacent to the wavelength conversion material. The selective filter may include a plurality of nanoparticles for absorbing light from the LED not down-converted by the wavelength conversion material layer, as described above, and/or it may have other features, such as those set forth in U.S. patent application Ser. No. 12/503,695, entitled "Single-Color Wavelength Converted Light Emitting Devices," which is hereby incorporated by reference in its entirety.

It is also contemplated that a perpendicular distance between the perimeter of the LED on the substrate and an edge of the substrate may be at least about 24 microns.

The phosphor-converted light emitting device as set forth above may emit light comprising a saturated color purity of at least about 85%, at least about 90%, at least about 95%, at least about 98%, or at least about 99%.

Referring to FIG. 7, the light emitted from the phosphor-converted light emitting device may have ccx and ccy coordinates that fall within the selective yellow color bin defined by the following equations (according to SAE J578; July, 2012), where y may be understood to represent ccy and x may be understood to represent ccx:

$$y=1.290x-0.100$$

$$y=0.138+0.580x$$

$$y=0.440 \text{ and}$$

$$y=0.940-x$$

Alternatively, the light emitted from the phosphor-converted light emitting device may have ccx and ccy coordinates that fall within the green color bin defined by the following equations (according to SAE J578; July, 2012), where y may be understood to represent ccy and x may be understood to represent ccx:

$$y=0.730-0.730x$$

$$x=0.630y-0.040$$

$$y=0.500-0.500x$$

Alternatively, the light emitted from the phosphor-converted light emitting device may have ccx and ccy coordinates that fall within the amber color bin defined by the following equations (according to SAE J578; July, 2012), where y may be understood to represent ccy and x may be understood to represent ccx:

$$y=x-0.120$$

$$y=0.390$$

$$y=0.790-0.670x$$

The LEDs described herein in any of the preceding embodiments may be Group III nitride-based LEDs formed from nitrogen and Group III elements such as aluminum, gallium and/or indium in the form of nitride layers epitaxially grown and doped as would be understood by one of ordinary skill in the art to produce an LED emitting in the green to UV spectrum, for example blue light. Such LEDs may be fabricated using methods known in the art.

Figure 5A:
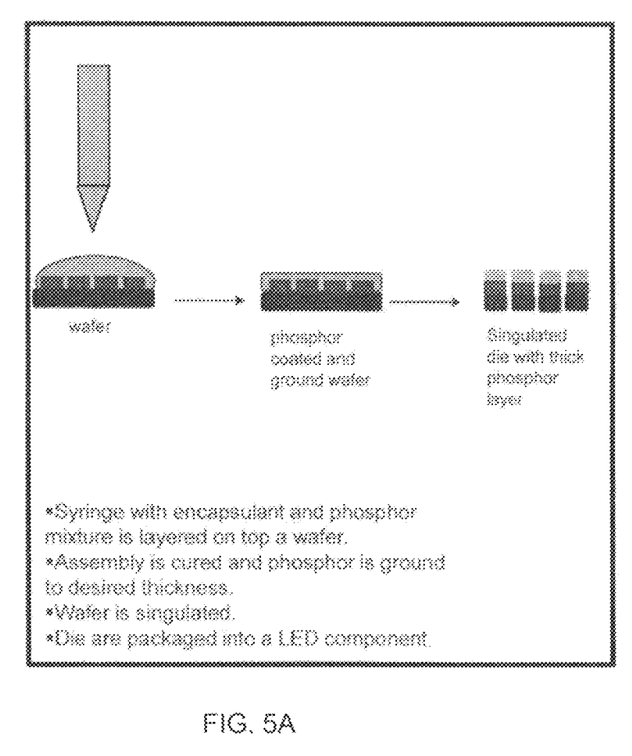
FIGS. 5A and 5B show exemplary methods of applying a wavelength conversion material onto a light emitting device.
Figure 5B:
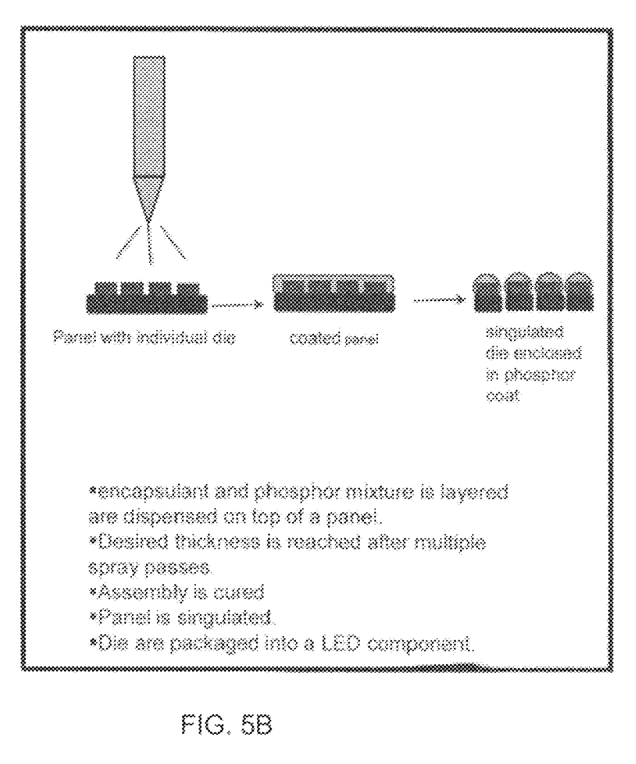

In some embodiments described above, the wavelength conversion material or phosphor may be coated on the LEDs. Prior to coating, phosphor particles may be dispersed in a silicone or other matrix material. In other embodiments, the wavelength conversion material can be placed in and/or on an encapsulant and/or optic of the LED, such as silicone, epoxy or glass. Additional phosphors, such as red nitride phosphors or green LuAG phosphors, can be mixed together in the matrix and/or positioned separately (in a remote phosphor configuration) on the optic and/or in discrete layers on the LED chip, as would be understood by one of skill in the art. The wavelength conversion material may be prepared and applied to the light emitting devices using methods known in the art, such as those described U.S. patent application Ser. Nos. 11/656,759 and 11/899,790, both of which are entitled "Wafer Level Phosphor Coating Method and Devices Fabricated Utilizing Method" and U.S. Pat. No. 8,058,088, entitled "Phosphor Coating Systems and Methods for Light Emitting Structures and Packaged Light Emitting Diodes including Phosphor Coating," all of which are hereby incorporated by reference in their entirety. FIGS. 5A and 5B also illustrate exemplary phosphor coating methods. In FIG. 5A, a syringe deposits an encapsulant and phosphor mixture on a wafer including a plurality of LEDs to form a phosphor coating. The assembly is cured and the phosphor coating is ground down to the desired thickness. The wafer is singulated and the individual die may be packaged to form LED components. In FIG. 5B, an encapsulant and phosphor mixture is deposited (e.g., sprayed) on a wafer or panel including a plurality of LEDs. The desired coating thickness may be reached after multiple spray passes. The assembly is cured and the wafer is singulated, and then individual die may be packaged to form LED components. One half the distance between adjacent LEDs (mesa regions) shown in FIGS. 5A and 5B corresponds to, after singulation, the perpendicular distance d between the perimeter of the LED on the substrate and an edge of the substrate, as described in the second embodiment.

The light emitting devices described above may include features, attributes and or rely on fabrication methods set forth in U.S. patent application Ser. No. 13/168,689, entitled "LED Structure with Enhanced Mirror Reflectivity," in U.S. patent application Ser. No. 12/503,695, entitled "Single-Color Wavelength Converted Light Emitting Devices," and/or in U.S. patent application Ser. No. 13/909,927, entitled "Light Emitting Diode Dielectric Mirror," all of which are hereby incorporated by reference in their entirety.

The technology described herein to produce phosphor-converted LEDs having a high color purity enables the fabrication of RGB systems for white light emission based on phosphor-converted LEDs. Traditionally, due to blue light leakage, it has been nearly impossible to produce phosphor-converted green LEDs that have a sufficient color purity for use in RGB systems, and traditional green LEDs are plagued by thermal stability problems.

The new RGB system may include: (a) a (first) phosphor-converted light emitting device as set forth above in any of the above embodiments, where the wavelength conversion material has a peak emission wavelength in the range of from about 498 to about 550 nm, such that the wavelength conversion material emits green light; (b) a second phosphor-converted light emitting device comprising: a second LED comprising a dominant wavelength in a range of about 425 nm to about 475 nm, such that the second LED emits blue light, and a second wavelength conversion material in optical communication with the second LED, where the second wavelength conversion material has a peak emission wavelength in a range of from about 610 nm to about 660 nm, such that the second wavelength conversion material emits red light; and (c) a third LED comprising a dominant wavelength in a range of about 425 nm to about 475 nm, such that the third LED emits blue light.

The second wavelength conversion material that emits red light may be as described for example, in U.S. patent application Ser. No. 13/152,863, filed Jun. 3, 2011 and entitled "Red Nitride Phosphor," which is hereby incorporated by reference in its entirety. One or both of the first and second phosphor-converted light emitting devices may comprise: the selective filter as described above in the first embodiment; the perpendicular distance on the substrate as described above in the second embodiment; and/or the mirror layer on one or more sidewalls as described above the third embodiment, as well as any and/or all additional features of these embodiments.

Advantageously, one or both of the first and second phosphor-converted light emitting devices in the RGB system may exhibit a saturated color purity of at least about 95%, at least about 98%, or at least about 99%.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. A light emitting system for emitting white light, the system comprising:
    (a) a first phosphor-converted light emitting device comprising a first light emitting diode (LED) die having a dominant wavelength in a range of about 425 nm to about 475 nm for blue light emission, the first LED die comprising a stack of epitaxial layers on a substrate with no intervening substrates, the stack of epitaxial layers forming a mesa region on the substrate; and
    a wavelength conversion material in optical communication with the first LED die, the wavelength conversion material emitting green light when excited by the blue light from the first LED die,
    wherein a perpendicular distance between a perimeter of the mesa region on the substrate and each edge of the substrate is at least about 34 microns and no greater than about 140 microns, and
    wherein the first phosphor-converted light emitting device comprises a saturated color purity of at least about 95%;
    (b) a second phosphor-converted light emitting device comprising:
        a second LED die having a dominant wavelength in a range of about 425 nm to about 475 nm for blue light emission, and
        a second wavelength conversion material in optical communication with the second LED die, the second wavelength conversion material emitting red light when excited by the blue light from the second LED die; and
    (c) a third light emitting device consisting of:
        a third LED die having a dominant wavelength in a range of about 425 nm to about 475 nm for blue light emission,
    wherein the light emitting system emits white light.

2. The phosphor-converted light emitting device of claim 1, wherein the perpendicular distance is at least about 44 microns.

3. The phosphor-converted light emitting device of claim 2, wherein the perpendicular distance is at least about 64 microns.

4. The system of claim 1, wherein the second phosphor-converted light emitting device has a saturated color purity of at least about 95%.

5. The system of claim 1, wherein the wavelength conversion material in optical communication with the first LED die comprises an $\alpha$-SiAlON ceramic doped with $Eu^{2+}$, a $\beta$-SiAlON ceramic doped with $Eu^{2+}$, $Lu_3Al_5O_{12}:Ce^{3+}$, $LU_{3-y}Y_yAl_5O_{12}:Ce^{3+}$, $LU_3Al_{5-x}Ga_xO_{12}:Ce^{3+}$, $LU_{3-y}Gd_yAl_{5-x}O_{12}:Ce^{3+}$, and/or $Lu_{3-y}Y_yAl_{5-x}Ga_xO_{12}:Ce^{3+}$, where $0<y<3$ and $0<x<5$.

* * * * *